United States Patent [19]

Yamashiro

[11] 4,039,973

[45] Aug. 2, 1977

[54] INITIATION CIRCUIT IN A CRYSTAL-CONTROLLED OSCILLATOR

[75] Inventor: Osamu Yamashiro, Kodaira, Japan

[73] Assignee: Hitachi, Ltd., Japan

[21] Appl. No.: 677,065

[22] Filed: Apr. 15, 1976

[30] Foreign Application Priority Data

Apr. 21, 1975  Japan .................................. 50-47547

[51] Int. Cl.² .............................................. H03B 5/36
[52] U.S. Cl. ............................... 331/116 R; 58/23 A; 331/158
[58] Field of Search ........................... 331/116 R, 158; 58/23 R, 23 A, 23 AC

[56] References Cited

U.S. PATENT DOCUMENTS

| 3,855,549 | 12/1974 | Huener et al. ................ 331/116 R X |
| 3,902,141 | 8/1975 | Berney ............................... 331/116 R |
| 3,959,744 | 5/1976 | O'Connor ........................... 331/116 R |

*Primary Examiner*—Siegfried H. Grimm
*Attorney, Agent, or Firm*—Craig & Antonelli

[57] ABSTRACT

In a crystal-controlled oscillator circuit comprising a complementary-MOS inverter provided with a crystal in the feed-back circuit, an initiation circuit is provided which comprises another complementary-MOS inverter connected in parallel to said MOS inverter only at the time of initiation. This oscillator circuit includes a parallel circuit connection of two complementary MOS inverters at the time of initiation and hence has a large driving power and a short oscillation initiation time. Because of rendering one complementary MOS inverter to be cut off at the time of normal oscillation, the power consumption is reduced.

5 Claims, 2 Drawing Figures

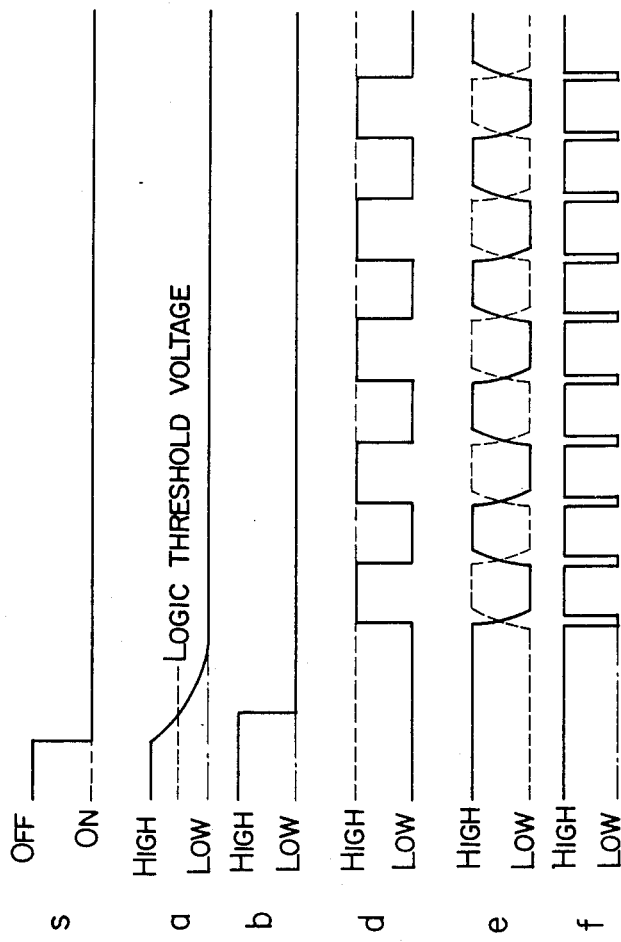

INITIATION CIRCUIT IN A CRYSTAL-CONTROLLED OSCILLATOR

BACKGROUND OF THE INVENTION

1. Field of the Invention

This invention relates to an initiator circuit or a driver circuit in an oscillation circuit and particularly to an initiator circuit suited for use in a crystal-controlled oscillator circuit including a metal-insulator-semiconductor (MIS) inverter, especially a complementary metal-oxide-semiconductor (C-MOS) inverter.

2. Description of the Prior Art

Oscillator circuits utilizing the complementary MOS technique have been well known as disclosed, for example, by S. S. Eaton, RCA Application Note, IACN 6539 January 1971 pages 192 - 205.

Conventional oscillator circuits having complementary MOS inverter, however, have required several seconds or more for the initiation of oscillation, namely, the driving of oscillation and hence considerable time is lost in assembly, adjustment and test. For reducing such a loss in time, a larger current may be allowed to flow to increase the driving force of the complementary MOS inverter. According to this method, however, the larger current is allowed to flow even after the initiation of oscillation, i.e. in the steady state. Thus, the power consumption becomes undesirably large.

In particular, when an oscillation circuit is used as the standard frequency generator in an electronic wrist watch, there are material requirements of low driving voltage and low power consumption. Therefore, even if the inverter of the oscillation circuit comprises silicon gate complementary MOS elements, the increase in the power consumption becomes a fatal drawback in practical use.

BRIEF DESCRIPTION OF THE INVENTION

Therefore, an object of this invention is to provide an initiator (or driver) circuit for an oscillator circuit having a metal-insulator-semiconductor (MIS) inverter provided with a crystal oscillator in the feed-back loop, capable of initiating oscillation in a shortened time without increasing the power consumption of the steady oscillation state.

Another object of this invention is to provide an initiator circuit for use in a crystal-controlled oscillator circuit in which two inverters are connected in parallel to increase the amplification factor of the oscillation circuit upon initiating oscillation and when the oscillation reaches a steady state one invertor is cut off from the circuit.

A further object of this invention is to provide an initiator circuit effective for use in the oscillator circuit of a wrist watch, having a large driving force and low power consumption in the normal oscillation state and capable of being integrated.

The other objects, features and advantages of this invention will become more apparent from the detailed description of the following embodiment of this invention when taken in conjunction with the accompanying drawings.

BRIEF DESCRIPTION OF THE DRAWING

FIG. 2 is a timing chart showing voltage waveforms at different points in the circuit of FIG. 1, for illustrating the operation of the circuit of FIG. 1.

DESCRIPTION OF THE PREFERRED EMBODIMENT

Figure 1:
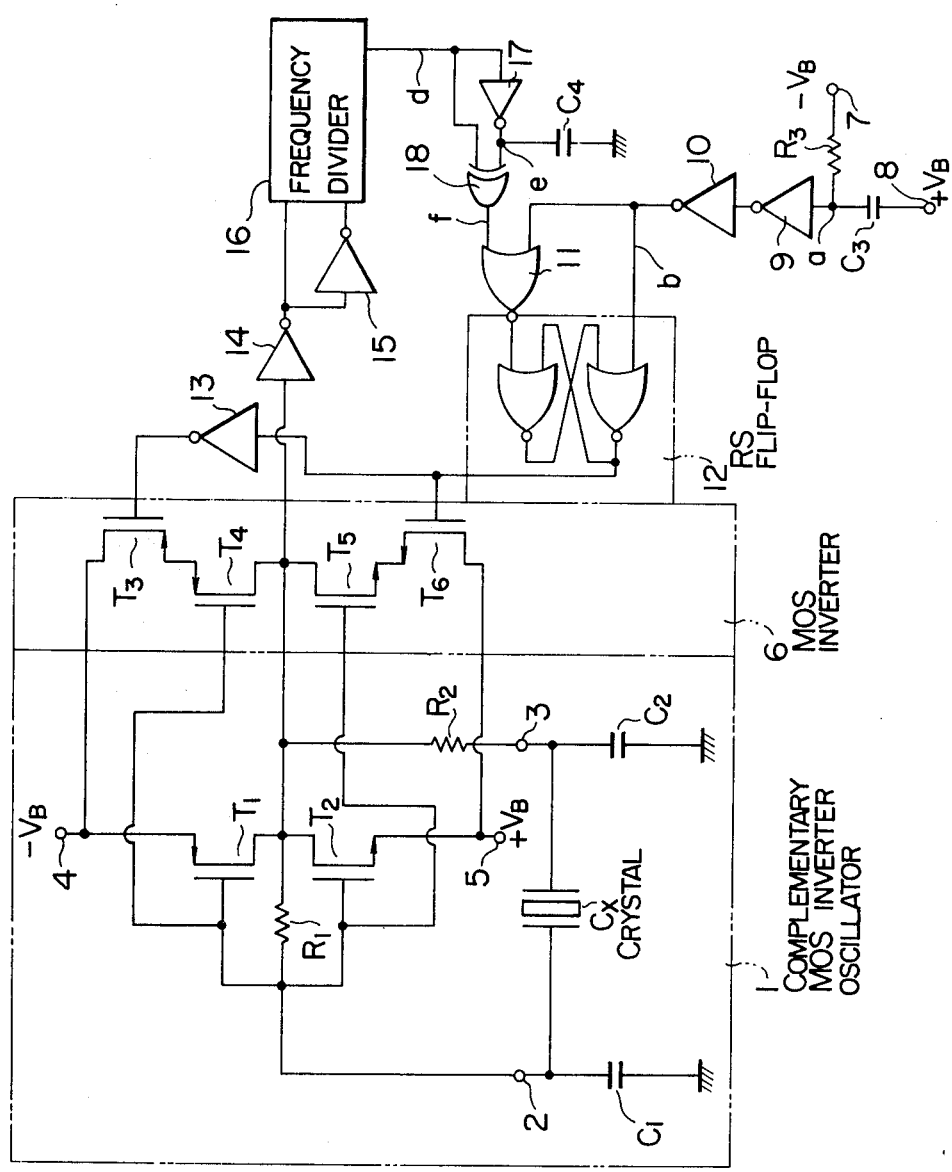
FIG. 1 is a circuit diagram showing an embodiment of the initiator circuit for use in an oscillator circuit according to this invention.

An embodiment of this invention will be described hereinbelow in conjunction with the drawing.

FIG. 1 shows a circuit diagram of an embodiment of the initiator circuit, namely, the driver circuit in an oscillation circuit, in which a MIS inverter oscillator 1, e.g., a complementary MOS inverter oscillator 1 (enclosed in a broken line) includes a crystal $C_x$ connected in a feed-back loop, a P-channel MOSFET $T_1$, an N-channel MOSFET $T_2$, resistors $R_1$ and $R_2$, capacitors $C_1$ and $C_2$. Here, other MIS FETs may be used for the MOS FETs. The P-channel MOSFET $T_1$ has the source connected to a negative voltage $(-V_B)$ supply terminal 4, the gate to one end of the resistor $R_1$ and to an input terminal 2, and the drain to the other end of the resistor $R_1$ and to one end of the other resistor $R_2$. The N-channel MOSFET $T_2$ has the source connected to a positive voltage $(+V_B)$ supply terminal 5, the gate to the gate of the MOSFET $T_1$, and the drain to the drain of the MOSFET $T_1$. The other end of the resistor $R_2$ is connected to an output terminal 3. The input and the output terminal 2 and 3 are grounded through the capacitors $C_1$ and $C_2$, respectively. The crystal $C_x$ is inserted between the input and the output terminals 2 and 3.

Another complementary MOS inverter 6, more generally, another MIS inverter 6 (enclosed in a broken line), arranged to be connected in parallel to said complementary MOS inverter only at the time of initiating oscillation, includes P-channel MOSFET's $T_3$ and $T_4$, and N-channel MOSFET's $T_5$ and $T_6$. The P-channel MOSFET $T_3$ has the drain connected to the negative voltage supply terminal 4 and the gate to the output side of an inverter 13. The P-channel MOSFET $T_4$ has the source connected to the source of the MOSFET $T_3$, the gate to the gate of the MOSFET $T_1$, and the drain to the drain of the MOSFET $T_1$. The N-channel MOSFET $T_5$ has the drain connected to the drain of the MOSFET $T_4$, and the gate to the gate of the MOSFET $T_2$. The N-channel MOSFET $T_6$ has the source connected to the source of the MOSFET $T_5$, the gate to the input side of the MOS inverter 13, and the drain to the positive voltage $(+V_B)$ supply terminal 5. Well, for example, the ground potential may be used for the $+V_B$ positive voltage. Further, a frequency divider circuit 16 is connected on the output side of the oscillator 1 through waveform shaping and strobing inverters 14 and 15. These circuits may be preferably integrated in one semiconductor chip together with an initiation control circuit to be described hereinbelow except that the crystal $C_x$ is connected externally. According to the desired constants of the oscillator circuit, the capacitors $C_1$ and $C_2$ and/or the resistors $R_1$ and $R_2$ may be connected externally, but usually these elements are also integrated.

The structure and the operation of the initiation control circuit for controlling the parallel connection of the MOS inverter circuit 6 to the MOS inverter oscillator 1 will be described referring also to the operational waveforms in FIG. 2.

When a power supply switch (not shown) is turned on as shown by the waveform s in FIG. 2, a source voltage is supplied to the power supply terminals 4, 5, 7 and 8, respectively. The potential at point a falls toward the $-V_B$ voltage level (low level) exponentially with a time constant determined by the capacitance of a capacitor $C_3$ and the resistance of a resistor $R_3$ as shown in the waveform $a$ in FIG. 2. Then, the potential at point $b$ established through waveform shaping and strobing inverters 9 and 10 changes from the high level 1 to the low level 0 after a certain time determined by said time constant, i.e. when the potential at point $a$ reaches the logic threshold voltage, as shown by the waveform $b$ in FIG. 2. Then, an RS flip-flop 12 formed of a pair of NOR circuits is reset to supply a low level output voltage. Hence, the RS flip-flop 12 supplies a low level voltage to the gate of the MOSFET $T_6$ and a high level voltage to the gate of the MOSFET $T_3$ through the inverter 13. Thus, the MOSFETs $T_3$ and $T_6$ are turned on and therefore the complementary MOS inverter 6 is connected in parallel to the complementary MOS inverter in the complementary MOS inverter oscillator 1. Thus, since the initiation of oscillation is driven with the two MOS inverters, the amplification factor of the oscillator circuit is increased, i.e. the driving force is increased, and the oscillation initiation time is reduced. Here, the capacitors $C_3$ and $C_4$ may be formed in a monolithic IC by the use of stray capacitances of MOS transistors.

On the other hand, the voltage level at the output side $d$ of the frequency divider 16 retains a low or a high level and does not change before the oscillation begins. Thus, the voltage at point $f$ on the output side of an exclusive OR circuit 18 which receives the voltage level at the point $d$ and the inverted voltage through a MOS inverter 17 is at high level. The output voltage level of the exclusive OR circuit 18 is supplied to one input of a NOR circuit 11 the output of which is supplied to the reset terminal of the RS flip-flop 12 as the resetting input. The NOR circuit 11 is applied with the potential at point $b$ as the output input. Thus, the RS flip-flop 12 is kept cleared at the time of power-on.

When oscillation is initiated in the inverter oscillator circuit 1 with the MOS inverter 6 being connected thereto, to thereby produce an oscillation signal, the voltage level at the output side $d$ of the frequency divider 16 changes alternatively high and low as shown by the waveform $d$ in FIG. 2. Then, the voltage level at the output point $e$ of the inverter 17 exhibits the change as shown by the waveform $e$ in FIG. 2 due to the time constant determined by the product of the overall resistance of the inverter 17 and the capacitance of the capacitor $C_4$. Therefore, the voltage at point $f$ becomes of low level for a period determined by the above-mentioned time constant at every change of the voltage level at point $e$ (as shown by the waveform $f$ in FIG. 2). Then, the NOR circuit 11 supplies a high level output which resets the RS flip-flop 12. Then, the RS flip-flop 12 supplies a high level voltage to the gate of the MOSFET $T_6$ and a low level voltage to the gate of the MOSFET $T_3$ to turn off the two MOSFETs.

Namely, the complementary MOS inverter 6 is separated from the complementary MOS inverter oscillator 1 in the normal oscillation period except the initiating period i.e., the driving period. Therefore, the power consumption in the normal oscillation period is reduced.

Here, it is noted that the existence of the frequency divider is not material in the circuit of FIG. 1. It may be omitted and the outputs of the inverters 14 and 15 may be used directly as the resetting signals.

In the case of applying this invention to an electronic wrist watch, the frequency divider 16 may be a frequency dividing part for dividing the standard oscillation frequency of the oscillator, e.g. 16,384 Hz. Further, it will be seen that the frequency divider 16 may be substituted with a well known circuit which can derive square waves of oscillation from the output of the inverter circuit in the oscillation circuit.

In the above embodiment, the inverter of the oscillation circuit was formed of complementary MOS transistors, but it will be apparent that other MIS transistors may be used in place of the complementary MOS transistors. Further, the control of the parallel circuit connection of the inverter of the initiator circuit with the inverter of the oscillator according to this invention may be modified in various ways. It will also be apparent that applications of the present invention are not limited to an electronic clock or wrist watch.

As has been described above, according to the initiator circuit in an oscillation circuit of this invention, since two complementary MOS inverters are connected in parallel only at the time of initiation of oscillation, the driving activity is large, oscillation initiation time is short and the power consumption during the normal oscillation is low.

What is claimed is:

1. In an oscillation circuit having a metal-insulator semiconductor (MIS) inverter connected with a crystal in a feed-back circuit, an oscillation initiating circuit comprising:
   another MIS inverter disconnected from the former MIS inverter during nomal oscillation; and
   means for connecting said another MIS inverter in parallel with the former MIS inverter at the time of initiating oscillation.

2. An oscillation initiating circuit according to claim 1, in which said inverter connecting means includes switching elements each provided with a control electrode, and respectively connected between sources of respective MIS transistors of said another MIS inverter and respective power supply terminals, and switching controlling means connected to said control electrodes for controlling said switching elements to the on-state in response to the turning-on of a power supply in initiating oscillation and to the off-state in response to the detection of the oscillation from said oscillator circuit in the normal oscillation.

3. An oscillation initiating circuit according to claim 2, in which each of said switching elements comprises a MIS transistor of the same conductivity type as a corresponding one of said MIS transistors of said another MIS inverter and has a source connected to the source of said corresponding one MIS transistor, a drain connected to a power supply terminal and a gate applied with a controlling voltage signal supplied from said switching controlling means.

4. An oscillation initiating circuit according to claim 2, in which said switching controlling means includes a frequency dividing circuit receiving an output of said MIS inverters and generating a square wave signal having a frequency which is equal to the oscillation frequency of said oscillation circuit divided at a predetermined frequency ratio, a flip-flop connected to voltage supply terminals, said flip-flop being set by the turning-on of a voltage supply and reset by the turning-off of the voltage supply and a reset circuit means for generating pulses at the rising and falling of the square wave signal from said frequency dividing circuit and resetting said flip-flop circuit, the output of aid flip-flop being supplied to the control electrode of each of said switching elements.

5. In an oscillator circuit having a complementary metal-oxide-semiconductor (MOS) inverter connected with a crystal in a feed-back loop, an initiating circuit comprising another complementary MOS inverter; and
means for connecting said another MOS inverter in parallel to the first-mentioned MOS inverter, said connecting means including a first and a second MOS transistor connected between respective MOS transistors of said another MOS inverter and power supply terminals for supplying different operating voltages and responsive to inputs applied to their gates for allowing energization of said another MOS inverter, and a switching control circuit coupled with the gates of said first and second MOS transistor and the output of said oscillation circuit and having a first means for generating an on-signal upon energization of said power supply terminals as said inputs to the first and second MOS transistor and a second means responsive to an output of said oscillator circuit after the initiation of oscillation for removing said on-signal, thus on-off controlling the first and second MOS transistor of said connecting means.

* * * * *